United States Patent [19]

Glicksman et al.

[11] Patent Number: 5,616,165

[45] Date of Patent: *Apr. 1, 1997

[54] METHOD FOR MAKING GOLD POWDERS BY AEROSOL DECOMPOSITION

[75] Inventors: Howard D. Glicksman, Wilmington, Del.; Toivo T. Kodas; Diptarka Majumdar, both of Albuquerque, N.M.

[73] Assignees: E. I. Du Pont de Nemours and Company, Wilmington, Del.; University of New Mexico, Alburquerque, N.M.

[*] Notice: The term of this patent shall not extend beyond the expiration date of Pat. No. 5,439,502.

[21] Appl. No.: 519,834

[22] Filed: Aug. 25, 1995

[51] Int. Cl.$^6$ ............................................. B25F 9/24
[52] U.S. Cl. .............................. 75/369; 75/371; 75/637
[58] Field of Search ............................ 75/367–371, 637

[56] References Cited

U.S. PATENT DOCUMENTS

| 5,421,854 | 6/1995 | Kodas et al. | 75/369 |
| 5,439,502 | 8/1995 | Kodas et al. | 75/369 |

Primary Examiner—George Wyszomierski

[57] ABSTRACT

The invention is directed to a method for the manufacture of substantially fully densified, finely divided particles of gold wherein the operating temperature is below the melting point of gold.

6 Claims, 4 Drawing Sheets

METHOD FOR MAKING GOLD POWDERS BY AEROSOL DECOMPOSITION

FIELD OF INVENTION

The invention is directed to an improved process for making gold powders. In particular, the invention is directed to a process for making such powders that are substantially fully densified, finely divided, with high purity and with spherical morphology.

BACKGROUND OF THE INVENTION

Thick film gold conductor compositions have been developed commercially for high adhesion strength fine line resolution microcircuit conductors, chip and wire bonding, electrical terminal contact metallization, and etchable pastes for thermal printer head and microwave applications. Precious metals other than gold are also used in thick film pastes but gold is specified for the high performance high reliability hybrid microcircuits used in military, medical, aerospace and instrumentation applications. To achieve high performance and reliability, reproducibility is essential and control of particle size and shape in the production of the gold powder is necessary.

There are many chemical methods of producing gold powders and each one may include variations involving pH, dilution, and temperature among others. A frequently used technique is to precipitate gold from chloroauric acid solution. This may be accomplished by a variety of active metals such as zinc, magnesium, iron, etc., by inorganic reducing agents such as ferrous sulfate, sodium sulfite, sulfur dioxide, and hydrogen peroxide, or organic reducing agents such as formic acid, formaldehyde, or others. However, these processes can not be easily controlled and therefore are not found to produce materials with uniform particle size and shape, both of which are very important in the improvement in the properties of thick film pastes.

The characteristics of the gold powder such as surface area, particle size, particle shape, etc. are dependent on the conditions from which the powder was made. Physical characteristics such as these influence the chemical processability and determine to a large extent the appearance, usefulness, and efficiency of the gold powder in the particular application.

With increasing circuit complexity and decreasing feature sizes, thick film pastes must be composed of pure and chemically uniform particles with very well controlled particle size distributions. Spray pyrolysis has emerged as a promising technique for the production of phase—pure powders with compositional homogeneity at the molecular level.

SUMMARY OF THE INVENTION

Figure 1:
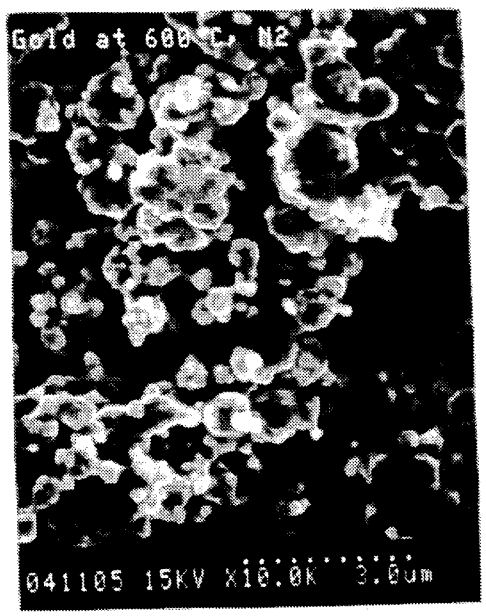
FIG. 1 is a scanning electron microscopy (SEM) photograph at magnification of 10,000× of gold powder that depicts substantially fully dense irregular particles.
Figure 2:
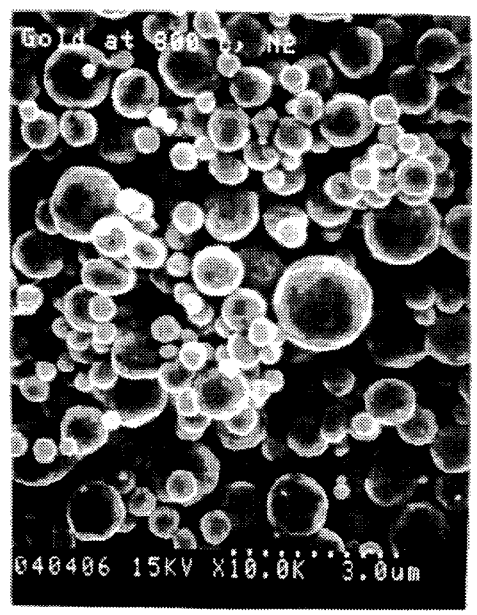
FIG. 2 is a SEM photograph at magnification of 10,000× of gold powder that depicts substantially fully dense spherical particles.

The invention is directed to a method for the manufacture of substantially fully densified, finely divided, particles of gold comprising the sequential steps:

A. Forming an unsaturated solution of a thermally decomposable gold containing compound in a thermally volatilizable solvent;

B. Forming an aerosol consisting essentially of finely divided droplets of the solution from step A dispersed in a carrier gas, the droplet concentration which is below the concentration where collisions and subsequent coalescence of the droplets results in a 10% reduction in droplet concentration;

C. Heating the aerosol to an operating temperature of at least 500° C. but below the melting point of gold by which (1) the solvent is volatilized, (2) the gold containing compound is decomposed to form pure gold particles and (3) the gold particles are densified; and D. Separating the particles of gold from the carrier gas, reaction by-products and solvent volatilization products.

DETAILED DESCRIPTION OF THE INVENTION

Gold Containing Compound

Any soluble gold salt can be used in the method of the invention. Examples of suitable salts are gold nitrate, gold chloride, gold hydroxide, gold oxide, gold acetate and gold tricyanide. Insoluble gold salts are not suitable. The gold containing compound may be used in concentrations as low as 0.002 mole/liter and upward to just below the solubility limit of the particular salt. It is preferred to not use concentrations below 0.002 mole/liter or higher than 90% of saturation.

While it is preferred to use water-soluble gold salts as the source of gold for the method of the invention, the method can, nevertheless, be carried out effectively with the use of other solvent soluble compounds such as organometallic gold compounds dissolved in non-aqueous solvents.

Operating Variables

The method of the invention can be carried out under a wide variety of operating conditions so long as the following fundamental criteria are met:

1. The concentration of the gold containing compound must be below the saturation concentration at the feed temperature and preferably at least 10% below the saturation concentration in order to prevent precipitation of solids before removal of the liquid solvent;

2. The concentration of the droplets in the aerosol must be sufficiently low so that it is below the concentration where collisions and subsequent coalescence of the droplets results in a 10% reduction in droplet concentration causing significant broadening of size distribution.

Though it is essential to operate under the saturation point of the gold containing compound, the concentration is not otherwise critical in the operation of the process. Much lower concentrations of the gold containing compound can be used. However, it will ordinarily be preferred to use higher concentrations to maximize the mass of particles that can be made per unit of time. Once a nebulizer is chosen, the concentration will determine the resulting particle size of the gold powder. The higher the concentration in a droplet, the more the mass in the droplet and therefore the larger the average particle size.

Any conventional apparatus for droplet generation may be used to prepare the aerosols for the invention such as nebulizers, Collison nebulizers, ultrasonic nebulizers, vibrating orifice aerosol generators, centrifugal atomizers, two-fluid atomizers, electrospray atomizers and the like. The particle size of the powder is a direct function of the droplet sizes generated. The size of the droplets in the aerosol is not critical in the practice of the method of the invention. However as mentioned above, it is important that the number of droplets not be so great as to incur excessive coalescence which may broaden the particle size distribution and so increase the average particle size.

In addition, for a given aerosol generator, concentration of the solution of the gold containing compound has an effect on the particle size of the powder. In particular, particle size is an approximate function of the cube root of the concentration. Therefore, the higher the gold containing compounds' concentration, the larger the particle size of the gold powder. If a greater change in particle size is needed, a different aerosol generator must be used.

Virtually any carrier gas which is inert with respect to the solvent for the gold containing compound and the gold powder, may be used as the carrier gas for the practice of the invention. Examples of suitable carrier gases are nitrogen, argon, helium, and the like. Forming gas (7% H2/N2) can be used though it is not required for the practice of this invention.

The temperature range over which the method of the invention can be carried out is quite wide and ranges from 500° C. to below the melting point of gold (approximately 1065° C.). At the lower end of the operating range temperature, irregular shaped, pure, densified, gold particles can be produced. This invention also allows for the production of spherical particles of gold. By operating at temperatures above 750° C. and using a gold salt such as gold nitrate and a nitrogen carrier gas, substantially fully densified, finely divided, spherical particles of gold can be produced at 750° C. which is significantly below the melting point of gold. Also, substantially fully densified, finely divided, spherical particles of gold can be produced at 900° C. using air for the carrier gas.

The type of apparatus used to heat the aerosol is not by itself critical and either direct or indirect heating may be used. For example, tube furnaces may be used or direct heating in combustion flames may be used.

Upon reaching the reaction temperature and after the particles are substantially fully densified, they are separated from the carrier gas, reaction byproducts and solvent volatilization products and collected by one or more devices such as filters, cyclones, electrostatic separators, bag filters, filter discs, and the like. The gas upon completion of the reaction consists of the carrier gas, decomposition products of the gold containing compound, and solvent vapor. Thus, in the case of preparing gold powder from aqueous gold nitrate using $N_2$ as the carrier gas, the effluent gas from the method of the invention will consist of nitrogen oxide(s), water, and $N_2$.

The present invention will be described in further detail by giving practical examples. The scope of the present invention, however, is not limited in any way by these practical examples.

Test Apparatus

Figure 3:
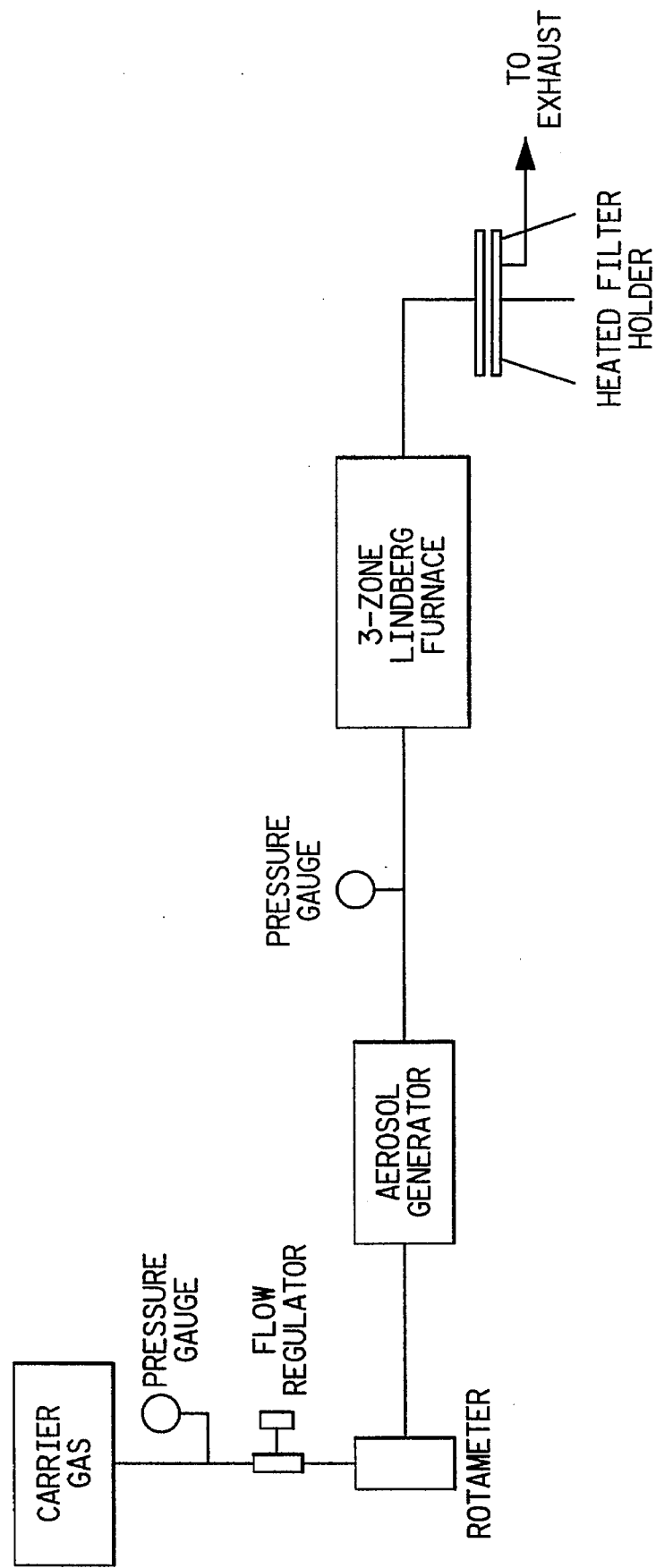
FIG. 3 is a schematic representation of an experimental apparatus used for spray pyrolysis.
Figure 4:
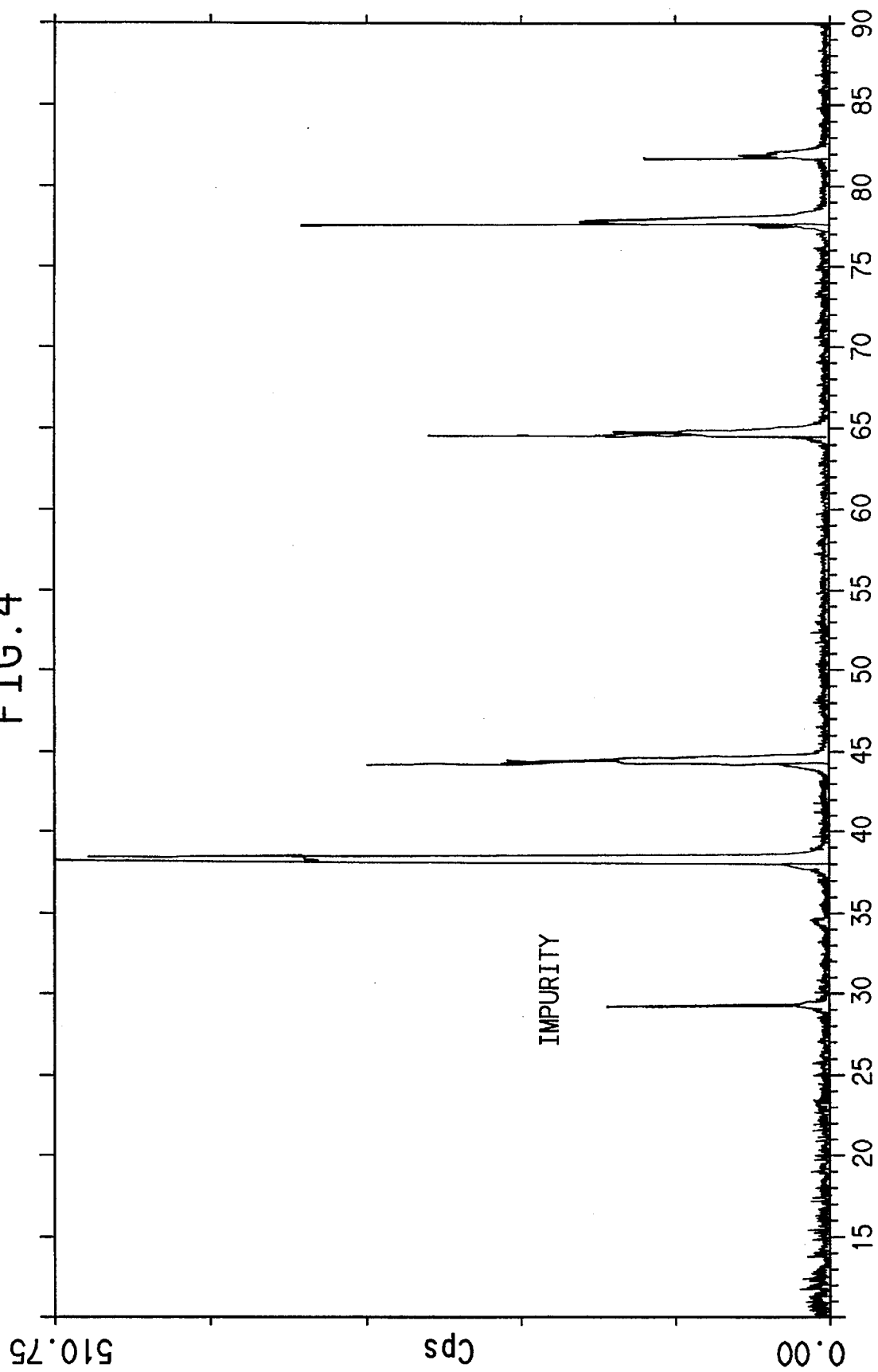
FIG. 4 is an X-ray diffraction pattern of Example 1 from Table 1 showing an impurity in gold powder.
Figure 5:
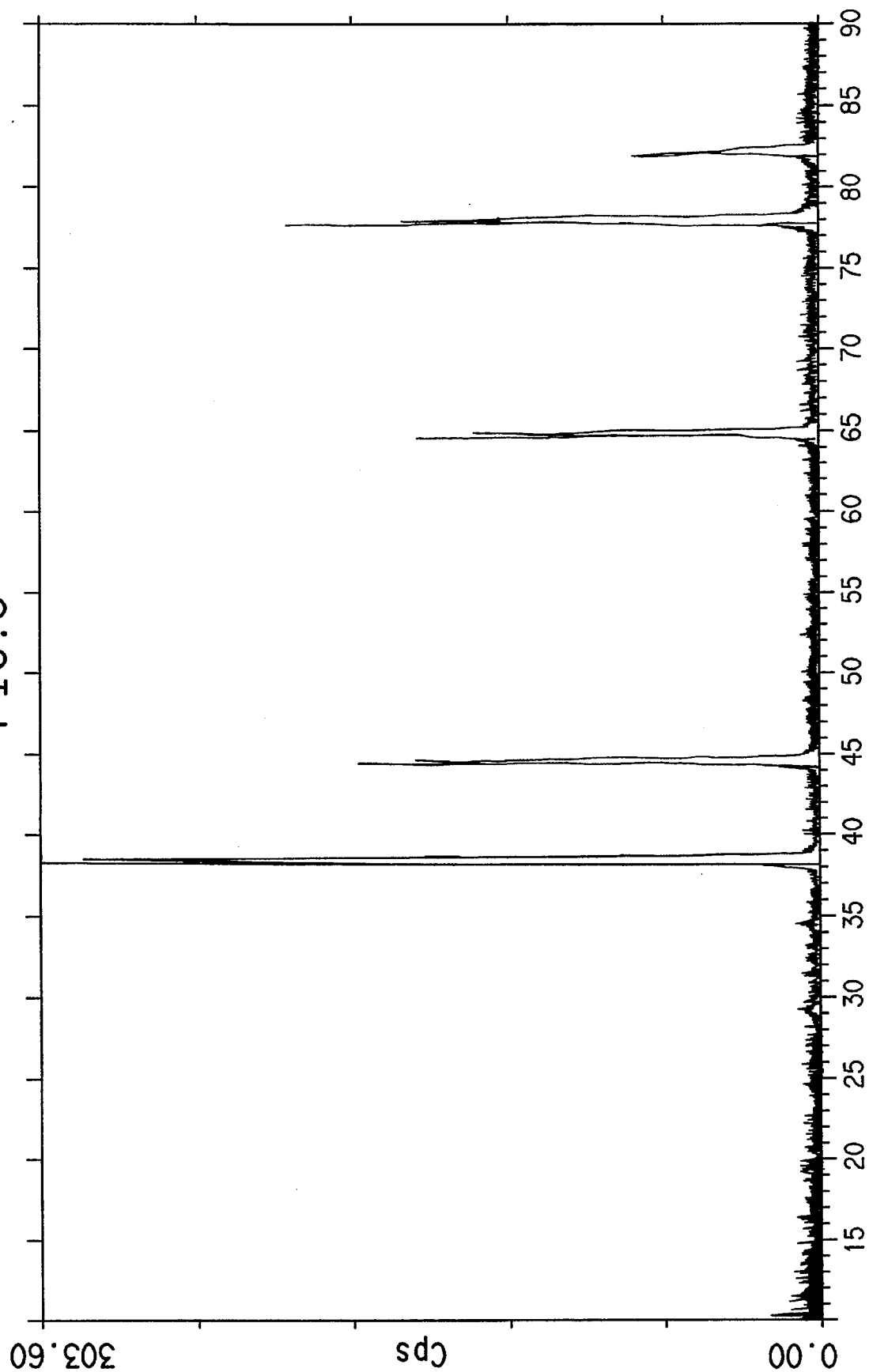
FIG. 5 is an X-ray diffraction pattern of Example 4 from Table 1 showing phase-pure gold powder.

The experimental apparatus used in this work is shown in FIG. 3. The flow of the carrier gas was adjusted with the regulator and measured with the rotameter. A modified ultrasonic Holmes home humidifier was used as the aerosol generator. A Coors mullite tube (180 cm long, 9 cm O.D., 8 cm I.D.) was used as the reactor which was heated by a Lindberg 3-zone furnace with a 91 cm heated region. The carrier gas flow rate and the reactor temperature determined the residence time of the aerosol in the reactor. The powders were collected on a Tuffryn membrane filter (142 cm dia., 0.45 micron pore dia.) supported on a heated stainless steel filter holder (Gelman 147 mm dia.).

EXAMPLES

Fourteen process runs were performed in which the method of the invention was demonstrated.

Gold Nitrate Solutions

For examples 1–8, a solution of gold (III) nitrate was made by dissolving gold (III) oxide powder in concentrated nitric acid. This nitrate solution was then atomized by the appropriate generator and sent through a 3 -zone Lindberg furnace. The nitric acid per gram of gold oxide content is given in Table 1 hereinbelow.

The operating conditions of the following examples are shown in Table 2 along with resulting properties of the gold powder.

TABLE 1

| Nitric Acid per gram of gold oxide | |
| --- | --- |
| Examples | ml |
| 1 | 10 |
| 2 | 10 |
| 3 | 10 |
| 4 | 12.5 |
| 5 | 20 |
| 6 | 12.5 |
| 7 | 12.5 |
| 8 | 10 |

Gold Chloride Solution

For examples 9–14, a gold chloride water solution was used. This gold chloride solution had a concentration of 30% gold and 10% hydrochloric acid by weight with the remainder water. This chloride solution was then atomized by the appropriate generator and sent through a 3-zone Lindberg furnace. The other operating conditions of these runs are shown in Table 2 along with the selected properties of the gold powder produced thereon.

TABLE 2

| Example | Aerosol Generator | Temp. Degree C. | Carrier Gas | Gold Salt | Residency Time, sec. | Shape by SEM | XXD Phase Purity |
| --- | --- | --- | --- | --- | --- | --- | --- |
| 1 | Collison | 400 | N2 | Nitrate | 8.3 | Irregular | Not Pure |
| 2 | Collison | 500 | N2 | Nitrate | 7.2 | Irregular | Pure |
| 3 | Collison | 600 | N2 | Nitrate | 6.4 | Irregular | Pure |
| 4 | Ultrasonic | 800 | N2 | Nitrate | 18.5 | Spherical | Pure |
| 5 | Ultrasonic | 900 | N2 | Nitrate | 15.2 | Spherical | Pure |
| 6 | Ultrasonic | 1000 | N2 | Nitrate | 15.8 | Spherical | Pure |
| 7 | Ultrasonic | 800 | Air | Nitrate | 18.5 | Spherical | Pure |

TABLE 2-continued

| Example | Aerosol Generator | Temp. Degree C. | Carrier Gas | Gold Salt | Residency Time, sec. | Shape by SEM | XXD Phase Purity |
|---|---|---|---|---|---|---|---|
| 8 | Ultrasonic | 1000 | Air | Nitrate | 15.8 | Spherical | Pure |
| 9 | Ultrasonic | 500 | N2 | Chloride | 16 | Irregular | Pure |
| 10 | Ultrasonic | 800 | N2 | Chloride | 8 | Irregular | Pure |
| 11 | Ultrasonic | 500 | 7% H2/N2 | Chloride | 16 | Irregular | Pure |
| 12 | Ultrasonic | 800 | 7% H2/N2 | Chloride | 8 | Irregular | Pure |
| 13 | Ultrasonic | 500 | Air | Chloride | 13.2 | Irregular | Pure |
| 14 | Ultrasonic | 700 | Air | Chloride | 13.5 | Irregular | Pure |

Example 1 prepared at 400° C. shows that the gold powder is irregular in shape and not phase-pure.

Examples 2 and 3 prepared at 500° and 600° C. show that phase-pure gold powder is produced though it is irregular in shape and not spherical.

Examples 4, 5, and 6 indicate that phase-pure, spherical gold powder is produced in the range 800° C.–1000° C. in nitrogen gas.

Examples 7 and 8 show that similar results can be obtained when the carrier gas is air.

Examples 9–14 show that phase-pure, irregular shaped gold powder can be produced from a gold chloride solution using N2 gas, forming gas (7% H2/N2) or air as the carrier gas at temperatures as low as 500° C.

What is claimed is:

1. A method for the manufacture of substantially fully densified, finely divided, particles of gold comprising the sequential steps:

A. Forming an unsaturated solution of a thermally decomposable gold containing compound in a thermally volatilizable solvent;

B. Forming an aerosol consisting essentially of finely divided droplets of the solution from step A dispersed in a carrier gas, the droplet concentration being below a concentration where collisions and subsequent coalescence of the droplets results in a 10% reduction in droplet concentration;

C. Heating the aerosol to an operating temperature of at least 500° C. but below the melting point of gold by which (1) the solvent is volatilized, (2) the gold containing compound is decomposed to form pure gold particles and (3) the gold particles are densified; and D. Separating the particles of gold from the carrier gas, reaction by-products and solvent volatilization products.

2. The method of claim 1 in which the thermally decomposable gold containing compound is gold nitrate or gold chloride.

3. The method of claim 1 in which the carrier gas is nitrogen, air, or forming gas (7% H2/N2).

4. The method of claim 1 in which the gold particles are spherical, the operating temperature is at least 750° C. but below the melting point of gold, and nitrogen is the carrier gas.

5. The method of claim 1 wherein the gold particles are spherical, the operating temperature is at least 900° C. but below the melting point of gold, and air is the carrier gas.

6. The method of claim 1 in which the thermally volatilizable solvent is deionized water or concentrated nitric acid.

* * * * *